US009041398B2

United States Patent
Ylihautala

(10) Patent No.: US 9,041,398 B2
(45) Date of Patent: May 26, 2015

(54) RF ANTENNA FOR MRI WITH A REMOVABLE CONDUCTOR

(75) Inventor: Mika Petri Ylihautala, Vantaa (FI)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 400 days.

(21) Appl. No.: 13/510,998

(22) PCT Filed: Dec. 15, 2010

(86) PCT No.: PCT/IB2010/055835
§ 371 (c)(1),
(2), (4) Date: May 21, 2012

(87) PCT Pub. No.: WO2011/077322
PCT Pub. Date: Jun. 30, 2011

(65) Prior Publication Data
US 2012/0249147 A1    Oct. 4, 2012

(30) Foreign Application Priority Data

Dec. 21, 2009  (EP) .................................... 09180056

(51) Int. Cl.
*G01V 3/00*    (2006.01)
*G01R 33/3415*  (2006.01)
*G01R 33/36*   (2006.01)

(52) U.S. Cl.
CPC .......... *G01R 33/3415* (2013.01); *G01R 33/365* (2013.01); *G01R 33/3664* (2013.01)

(58) Field of Classification Search
CPC ...................................................... G01R 33/34
USPC ................... 324/318, 322; 600/422
See application file for complete search history.

(56) References Cited

U.S. PATENT DOCUMENTS

| 4,881,034 | A  |   | 11/1989 | Kaufman et al. |
|-----------|----|---|---------|----------------|
| 4,897,604 | A  | * | 1/1990  | Carlson et al. ................. 324/318 |
| 5,457,387 | A  |   | 10/1995 | Patrick et al. |
| 5,548,218 | A  |   | 8/1996  | Lu |
| 5,594,337 | A  |   | 1/1997  | Boskamp |
| 5,602,557 | A  |   | 2/1997  | Duerr |
| 6,498,489 | B1 | * | 12/2002 | Vij ............................... 324/322 |
| 6,591,128 | B1 | * | 7/2003  | Wu et al. ....................... 600/422 |
| 2008/0129296 | A1 |   | 6/2008 | Fischer et al. |

FOREIGN PATENT DOCUMENTS

| EP | 1026513   | A2 | 8/2000 |
| JP | 09131332  | A  | 5/1997 |
| WO | 0239135   | A2 | 5/2002 |
| WO | 2008025146 | A1 | 3/2008 |

OTHER PUBLICATIONS

Roemer, P. B., et al.; The NMR Phased Array; 1990; MRM; 16:192-225.

* cited by examiner

*Primary Examiner* — Louis Arana

(57) ABSTRACT

An RF transmit and/or receive antenna is disclosed, especially in the form of a coil structure or coil or loop arrangement, having one or more removable conductors, especially for use in a magnetic resonance imaging (MRI) system or a magnetic resonance (MR) scanner, for transmitting RF excitation signals (Bi field) for exciting nuclear magnetic resonances (NMR), and/or for receiving NMR relaxation signals. The RF antenna is provided such that it can be adapted in an easy way according to an application which either requires a large opening through the RF antenna or a parallel imaging capability.

20 Claims, 2 Drawing Sheets

RF ANTENNA FOR MRI WITH A REMOVABLE CONDUCTOR

FIELD OF THE INVENTION

The invention relates to an RF transmit and/or receive antenna, especially in the form of a coil structure or coil or loop arrangement, having one or more removable conductors or conductor structures, especially for use in a magnetic resonance imaging (MRI) system or a magnetic resonance (MR) scanner, for transmitting RF excitation signals ($B_1$ field) for exciting nuclear magnetic resonances (NMR), and/or for receiving NMR/RF relaxation signals. The invention further relates to a magnetic resonance imaging (MRI) system or a magnetic resonance (MR) scanner comprising such an RF transmit and/or receive antenna.

BACKGROUND OF THE INVENTION

In an MRI system or MR scanner, an examination object, usually a patient, is exposed to a uniform main magnetic field ($B_0$ field) so that the magnetic moments of the nuclei within the examination object tend to rotate around the axis of the applied $B_0$ field (Larmor precession) with a certain net magnetization of all nuclei parallel to the $B_0$ field. The rate of precession is called Larmor frequency which is dependent on the specific physical characteristics of the involved nuclei, namely their gyromagnetic ratio, and the strength of the applied $B_0$ field. The gyromagnetic ratio is the ratio between the magnetic moment and the spin of a nucleus.

By transmitting an RF excitation pulse ($B_1$ field) which is orthogonal to the $B_0$ field, generated by means of an RF transmit antenna, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the relaxation processes of the longitudinal and transversal components of the net magnetization begin, until the net magnetization has returned to its equilibrium state. NMR relaxation signals which are emitted by the transversal relaxation process, are detected by means of an RF receive antenna. The received NMR signals which are time-based amplitude signals, are Fourier transformed to frequency-based NMR spectrum signals and processed in a known manner for generating an MR image of the examination object.

The above RF transmit and/or receive antennas are known both in the form of so-called MR body coils which are fixedly mounted within an examination space of an MRI system for imaging a whole examination object, and as so-called MR surface coils which are directly arranged on a local zone or area to be examined and which are constructed e.g. in the form of flexible pads or sleeves or cages (head coil or birdcage coil). For examining a local zone or area, interventional devices like catheters or another invasive device comprising an RF transmit and/or receive antenna especially in the form of a small coil or loop for receiving MR relaxation signals are also known.

As to the shape of the examination space, two types of MRI systems or MR scanners can be distinguished. The first one is the so-called open MRI system (vertical system) which comprises an examination zone, which is located between the ends of a vertical C-arm arrangement. The second one is a horizontal MRI system, also called axial MRI system, which comprises a horizontally extending tubular or cylindrical examination space.

U.S. Pat. No. 5,457,387 discloses an axial MRI apparatus in which an RF coil assembly is provided having a pair of end rings supported by a gradient coil assembly, wherein between the pair of end rings a plurality of longitudinally coil elements extend which are mechanically and selectively attachable and detachable to/from the gradient coil assembly. By such an RF coil assembly, critical diameter reductions within the magnet bore of the MRI apparatus shall be prevented and a larger patient aperture shall be obtained.

SUMMARY OF THE INVENTION

It has revealed that detaching or removing one or more coil elements of an RF antenna can detrimentally influence the resonant properties of the RF antenna so that the sensitivity of the RF antenna and the image quality is deteriorated.

One object underlying the invention is to provide an RF transmit and/or receive antenna, especially for use in MRI systems, which antenna comprises one or more removable antenna elements, wherein the resonant properties of the RF antenna are not influenced or influenced only to a minimum when one of the at least one removable antenna element is removed.

Another object underlying the invention is to provide an RF transmit and/or receive antenna especially in the form of an MR surface coil which can be adapted according to the demands of a certain NMR examination with respect to either a large opening through the antenna, or a parallel imaging capability without substantially influencing the resonant properties of the antenna.

These objects are solved according to claim 1 by an RF transmit and/or receive antenna comprising a first conductor structure forming a first mesh which is resonant at a desired RF frequency, and at least one second conductor structure which can be coupled into the first conductor structure so that the first mesh is divided by the at least one second conductor structure into at least a second and a third mesh, wherein the at least one second conductor structure is tuned such that the second and third mesh is each resonant at the same or substantially the same desired frequency as the first mesh.

The dependent claims disclose advantageous embodiments of the invention.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention which are given with reference to the drawings.

DETAILED DESCRIPTION OF EMBODIMENTS

Figure 1:
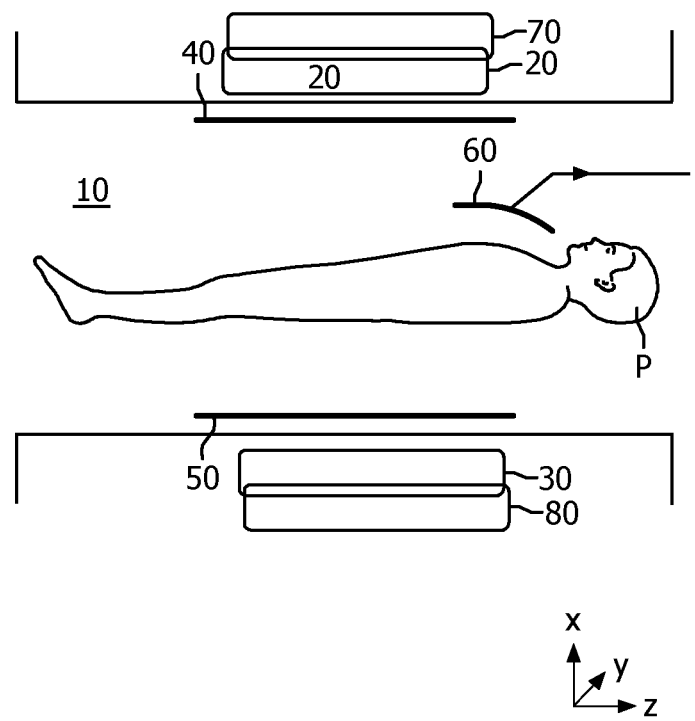
FIG. 1 shows a diagrammatic side elevation of an MRI system.

FIG. 1 shows substantial components of an MRI system which can be provided with an RF transmit and/or receive antenna according to the invention for the transmission of RF excitation pulses and/or for the reception of MR/RF relaxation signals. In FIG. 1, a vertical (open) MRI system is exemplarily shown having an examination zone 10 between the upper and the lower end of a C-arm structure. However, the RF transmit and/or receive antenna according to the invention can also be used in a horizontal or axial MRI system which comprises a horizontally extending tubular or cylindrical examination space as generally know.

Above and underneath the examination zone 10 there are provided respective magnet systems 20, 30 for generating an essentially uniform main magnetic field ($B_0$ field) for aligning the nuclear spins in the object to be examined, wherein the magnetic flux density (magnetic induction) may be in the order of magnitude of from some tenths of Tesla to some Tesla. The main magnetic field essentially extends through a patient P in a direction perpendicular to the longitudinal axis of the patient P (that is, in the x direction).

Generally, a planar or at least approximately planar RF transmit antenna 40 (especially in the form of an RF surface resonator) serves to generate the RF transmit excitation pulses ($B_1$ field) at the MR frequencies, said RF transmit antenna 40 being arranged at or on at least one of the magnet systems 20, 30. A planar or at least approximately planar MR/RF receive antenna 50 serve to receive subsequent NMR relaxation signals. This antenna may also be formed by an RF surface resonator provided at or on at least one of the magnet systems 20, 30. At least one common RF/MR antenna, especially an RF surface resonator, can also be used both for the RF transmission and the MR reception if it is suitably switched over between transmitting and receiving, or the two RF antennas 40, 50 can both serve for the alternating transmission of RF pulses and the reception of MR signals in common.

At least one of these RF transmit and/or receive antennas 40, 50 can be provided in the form of an RF transmit and/or receive antenna, respectively, according to the invention.

Furthermore, for the spatial or slice selection and spatial encoding of the received MR relaxation signals emanating from the nuclei (localization of the excited states), there is also provided a plurality of gradient magnetic field coils 70, 80 by which three gradient magnetic fields are generated which extend in the direction of the x axis. A first gradient magnetic field varies essentially linearly in the direction of the x axis, while a second gradient magnetic field varies essentially linearly in the direction of the y axis, and a third gradient magnetic field varies essentially linearly in the direction of the z axis.

Finally, electrical accessory devices or auxiliary equipments are provided for given examinations. Such a device is, for example, an RF receive antenna in the form of an RF/MR surface coil 60 which is used in addition or as an alternative to the permanently build-in planar RF receive antenna 50 (body coil) and which is arranged directly on the patient P or the zone to be examined. Such an RF/MR surface coil 60 can be constructed as a flexible pad or a sleeve or cage and can comprise or be provided in the form of an RF transmit and/or receive antenna according to the invention.

The above and the following principles of the invention and considerations are also applicable in case of an axial or horizontal MRI system in which a patient or another examination object is guided in an axial direction through a cylindrical or tubular examination space 10. The shapes and dimensions of the magnets and RF transmit and/or receive antennas are adapted to the shape of the cylindrical or tubular examination space in a known manner.

Further, the RF antenna according to the invention is preferably used as an RF/MR receive antenna for receiving MR relaxation signals only. However, the principles of the invention are applicable also for an RF transmit antenna for transmitting RF excitation pulses, and for an RF antenna which is provided both for transmitting RF excitation pulses and for receiving MR relaxation signals. All these RF antennas can be used both in a vertical (open) MRI system and in a horizontal or axial MRI system. For covering all these alternatives, in the following it is commonly referred to an RF transmit and/or receive antenna.

Generally, the above RF transmit and/or receive antennas can have each one or more conductor structure (i.e. antenna elements) which are each resonant for transmitting and/or receiving RF signals independently from other such conductor structures or segments of the RF antenna, and which are provided each with own electronic RF transmit and/or receive units like RF waveform generators, RF power amplifiers and/or RF receivers as generally known, so that a plurality of independently operable RF transmit and/or receive channels is provided.

Such multi channel systems are typically used to improve the parallel imaging capabilities of the whole RF transmit and/or receive antenna and to some degree improve the signal to noise ratio (S/N) of the generated MR images especially in close proximity to the conductors of the RF transmit and/or receive antenna.

Figure 2:
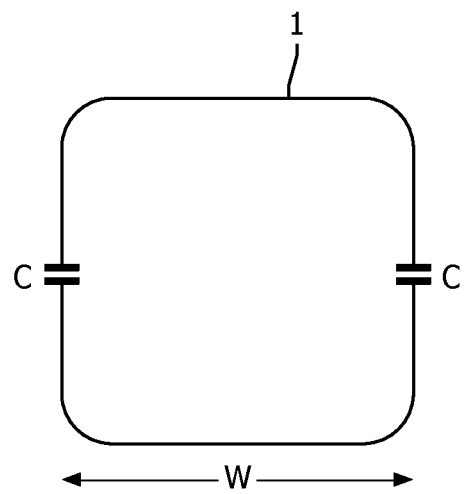
FIG. 2 shows an example of an RF antenna in the form of a single coil or single loop antenna.
Figure 3:
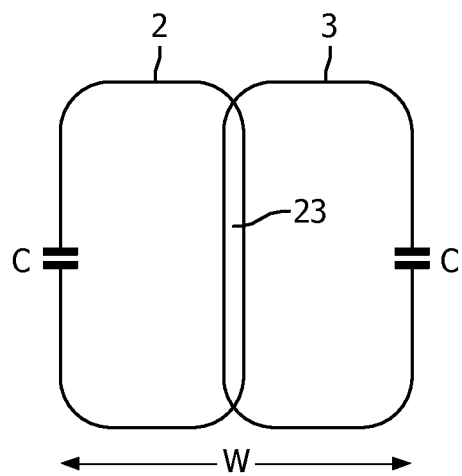
FIG. 3 shows an example of an RF antenna comprising two resonant coils or loops.

However, especially in case of an RF surface coil, a problem with such multi element antennas may be that the access through the RF antenna (which is sometimes desired for certain examinations) is limited or difficult. FIGS. 2 and 3 show this problem for an exemplary very simple structure of an RF transmit and/or receive antenna in the form of a (surface) coil structure. FIG. 2 shows a single element RF antenna having one loop or coil 1 through which an access is comparatively simple due to the large opening which is enclosed by the coil 1. In comparison to this, the two element RF antenna according to FIG. 3 is dimensioned nearly to the same size W as the one element RF antenna according to FIG. 2, however, it comprises a first coil 2 and a second coil 3 for enabling parallel imaging, wherein both coils 2, 3 have a common overlapping conductor structure 23 which considerably limits the access through the RF antenna.

The demands on an RF transmit and/or receive antenna with respect to either a large opening or a parallel imaging capability are different for different kinds of examinations and/or different kinds of examination objects. Consequently, the appropriate RF transmit and/or receive antenna has to be selected and possibly arranged within the MRI system before conducting such an examination. This is of course considered cumbersome especially in case that the demands change during the examination of one and the same object. This may happen for example in case that at first a diagnostic imaging shall be made for which the image quality and parallel imaging properties are more important than the access to the object, and then an interventional device like a catheter or a biopsy needle or another invasive device shall be introduced into the object for examining a local zone or area for which a sufficiently large free access to the object is needed especially if the RF transmit and/or receive antenna is a surface coil which is arranged directly on the zone to be examined.

Another example for such changing demands is that after a diagnostic MR imaging, a HIFU (high intensity focused ultrasound) therapy shall be made in which ultrasound has to be transmitted through the RF surface coil onto the object. In order to avoid any disturbance of the ultrasound field, no conductor structures may extend through this field and consequently through the opening of the RF antenna.

According to the invention this problem is overcome by providing an RF transmit and/or receive antenna which on the one hand has a parallel imaging capability and on the other hand can be provided in an easy way with an opening which allows an easy access through the RF antenna, however without considerably changing the resonant properties of the RF antenna.

Alternatively, according to the invention a single channel RF transmit and/or receive antenna having a large opening for allowing an easy access through the RF antenna is provided such that a parallel imaging capability can be obtained in an easy way without reducing the region of interest of the whole RF antenna and without considerably changing the resonant properties of the RF antenna in comparison to the single element RF antenna.

One basic idea underlying the invention is to provide an RF transmit and/or receive antenna comprising at least one first conductor structure, especially being arranged in the form of one or more resonant coils or loops, which first conductor structure forms a first mesh (i.e. encloses an opening) which is especially dimensioned such that an access through it to an examination object or a region of interest of such an object is allowed, wherein at least one second conductor structure is provided which can be electromagnetically coupled or connected to the first conductor structure such that it divides the first mesh into at least a second and a third mesh (i.e. it extends through the opening of the first conductor structure), wherein the second conductor structure is tuned such that the second and the third mesh is each resonant at the same or substantially the same desired frequency as the first mesh (i.e. without the second conductor structure), thus providing a parallel imaging capability of the RF transmit and/or receive antenna.

Figure 4:
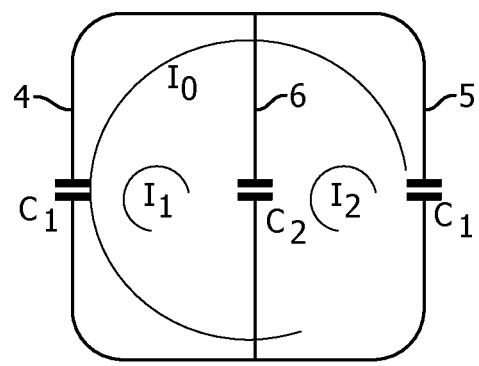
FIG. 4 shows an embodiment of an RF antenna according to the invention.

Such an RF transmit and/or receive antenna is schematically shown in an exemplary embodiment in FIG. 4. It comprises the first conductor structure in the form of two first conductors 4, 5 which together form a first mesh in the shape of a loop or a coil antenna having a substantially circular or, as shown in FIG. 4, a substantial rectangular form, enclosing the above mentioned opening. Further, the RF antenna comprises the second conductor structure in the form of one second conductor 6 extending through the opening and being electromagnetically coupled or connected with the two first conductors 4, 5 and by this forming a second and a third mesh within the first mesh. This coupling is mechanically provided such that the second conductor 6 can be removed from the first conductors 4, 5 and again be coupled to these conductors 4, 5 in an easy way. Further, the first conductors 4, 5 are provided each with a first serial capacitor C1, and the second conductor 6 is provided with a second serial capacitor C2.

Figure 5:
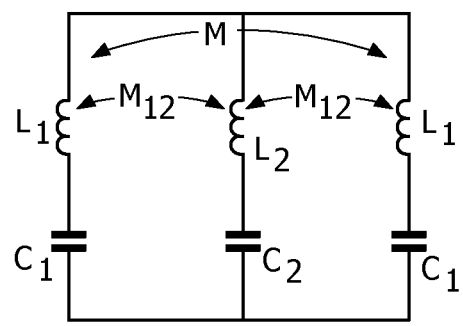
FIG. 5 shows an equivalent circuit of the RF antenna according to FIG. 4.

FIG. 5 shows the equivalent circuit of the RF antenna according to FIG. 4. The two first conductors 4, 5 are each provided by a series connection of the first capacitor C1 and a first inductance L1, and the second conductor 6 is provided by a series connection of the second capacitor C2 and a second inductance L2. Further, in this figure, the mutual inductance M between the two first conductors 4, 5 and the mutual inductances M12 between each of the first conductor 4; 5 and the second conductor 6 is indicated. Further, it is to be assumed that the electromagnetic energy which is received and/or transmitted by means of the RF antenna, is coupled out and/or into the RF antenna by means of each a preamplifier or generator, respectively, in parallel with (or as a part of) both the first capacitors C1.

By means of this RF antenna, a first single current mode I0 can be generated by means of the two first conductors 4, 5 forming the first mesh if the second conductor 6 is removed. Further, if the second conductor 6 is coupled to the first conductors 4, 5, a second current mode I1 is initiated in the second mesh, and a third current mode I2 is initiated in the third mesh, wherein the second and the third current mode I1, I2 are equal in this example.

The value of the second capacitor C2 within the second conductor 6 is chosen to isolate the two second current modes I1, I2 to:

$$C_2 = \frac{1}{\omega^2(L_2 - M - 2M_{12})}$$

wherein the frequency ω of these current modes I1, I2 is:

$$\omega = \frac{1}{\sqrt{C_1(L_1 + M)}}.$$

The frequency ω is the desired resonant frequency of the RF antenna and is chosen for use of the RF antenna in an MRI system to the MR frequency by appropriately selecting the value of the first capacitors C1.

In this case, if the second conductor 6 is removed, the above first single current mode I0 has the same resonant frequency as the second and the third current mode I1, I2, which occur if the second conductor 6 is coupled to the first conductors 4, 5.

By this, the RF antenna can be used either as a two element or a two channel antenna (e.g. for parallel imaging), or as a one element or one channel antenna by removing the second conductor 6 (if a large opening is desired e.g. for obtaining access to an examination object), both at the same resonant frequency.

If the second conductor 6 is removed, both preamplifiers or generators in parallel to each the first capacitors C1 see the same resonant conductor structure 4, 5. In case of receiving signals, the information of one of the two preamplifiers can be either abandoned or kept, depending on the needs and the desired signal reconstruction, considering the correlation and particularly the noise of the received signals.

As mentioned above, the two element coil shown in FIGS. 4 and 5 is only an example. Of course an RF transmit and/or receive antenna can be provided with a first conductor structure having more than two elements, i.e. having more than two first conductors 4, 5, and/or more than one removable second conductor structure (or one second conductor structure being composed from more than one removable conductor) which can be removed without substantially influencing the resonant properties of the RF antenna.

By this, when coupling the second conductor structure to the first conductor structure, more than a second and a third mesh can be provided, e.g. three or five etc. meshes for obtaining more parallel imaging capabilities.

Further, the sizes or dimensions of the meshes which are provided by coupling the second conductor structure to the first conductor structure can all be the same or different from each other.

Further, if more than one second conductor 6 or second conductor structure is provided, they can be tuned such that according to the demands, one or more or all of these second conductors or conductor structures can be removed without substantially influencing the resonant properties of the RF antenna.

Further, the second conductor 6 can have another form than a straight form, e.g. a curved form.

According to another embodiment of the invention, at least one of the first conductors 4, 5 or conductor structures can be made tunable in order to compensate a possible frequency shift when removing the removable (second) conductor 6.

In another embodiment of the invention, the removable conductor structure can be combined with an isolating amplifier to allow an increase of the coupling with or without the removable conductor structure as outlined in: "The NMR Phased Array", P. B. Roemer, W. A. Edelstein, C. E. Hayes, S. P. Souza, O. M. Mueller, in Magnetic Resonance in Medicine, Vol. 16, Is. 2, p. 192-225 (1990).

Finally, the removable second conductor structure can be made disposable. Especially if the second conductor structure needs to be sterilized, it could be preferable to sell it in a sterile package as a disposable unit. Such use could be of advantage in interventional MRI guided procedures. The user can at any point of the intervention attach or remove the sterile disposable second conductor structure.

Finally, the above principles of the RF transmit and/or receive antenna according to the invention can be applied for a planar whole body coil and a tubular whole body coil which both are fixedly installed in a vertical or an axial MRI system, respectively, and it can be applied for an MR surface coil like a flexible pad to be positioned directly on a region to be examined, or a birdcage coil etc.

While the invention has been illustrated and described in detail in the drawings and foregoing description, such illustration and description are to be considered illustrative or exemplary and not restrictive, and the invention is not limited to the disclosed embodiments. Variations to embodiments of the invention described in the foregoing, e.g. with respect to other forms and dimensions of the first conductors 4, 5 and the second conductor 6, as well as with respect to their number and positioning in relation to each other are possible without departing from the basic principle of the invention as defined by the accompanying claims.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An RF antenna comprising:
   a first conductor structure forming a first mesh which is resonant at a desired RF frequency, and
   at least one second conductor structure which can be coupled into the first conductor structure so that the first mesh is divided by the at least one second conductor structure into at least a second and a third mesh,
   wherein the at least one second conductor structure is tuned such that the second and third mesh are each resonant at the same or substantially the same frequency as the first mesh.

2. The RF antenna of claim 1, wherein the second conductor structure can be removably electrically coupled into the first conductor structure.

3. The RF antenna of claim 1, wherein the at least one second conductor structure is tuned by means of a capacitor which is connected in series into the second conductor structure.

4. The antenna of claim 1, wherein the at least one second conductor structure is a single electrical conductor.

5. The RF transmit antenna of claim 1, wherein the first conductor structure provides a first mesh in the form of at least one loop or coil.

6. The RF antenna of claim 5, wherein the at least one second conductor structure comprises a single conductor which divides the first mesh into a second mesh a third mesh having substantially the same sizes as each other.

7. The RF antenna of claim 1, wherein the RF antenna is a surface coil or birdcage coil or breast coil in an MRI system.

8. The RF antenna of claim 1, wherein the RF antenna is an RF/MR surface coil in a high intensity focused ultrasound therapy apparatus.

9. The RF antenna of claim 1, wherein the RF antenna is a whole body coil in a vertical or an axial MRI system.

10. An MRI system or MR scanner comprising a whole body coil according to claim 9.

11. The RF antenna of claim 1, wherein the RF antenna is an RF transmit antenna connected to a generator.

12. The RF antenna of claim 1, wherein the RF antenna is an RF receive antenna connected to a preamplifier.

13. The RF antenna of claim 1, wherein the first conductor structure comprises:
   first and second capacitors;
   one electrical conductor extending between first ends of the first and second capacitors; and
   an other electrical conductor extending between second ends of the first and second capacitors.

14. The RF antenna of claim 13, wherein the at least one second conductor structure comprises a third capacitor connected in series into the second conductor structure.

15. The RF antenna of claim 14, wherein the at least one second conductor structure is removably electrically connected between the one electrical conductor and the other electrical conductor of the first conductor structure.

16. An apparatus including at least a first reconfigurable RF antenna, wherein the first reconfigurable RF antenna comprises:
   a first electrical conductor structure including a mesh having a shape of a loop, and
   at least one second electrical conductor structure which is removably electrically connected to the first electrical conductor structure so that the first mesh is divided by the at least one second electrical conductor structure into at least a second mesh and a third mesh, each of the second mesh and third mesh having the shape of a loop,
   wherein the second and third mesh are each resonant at a same, or substantially the same, frequency as the first mesh.

17. The apparatus of claim 16, wherein the first electrical conductor structure comprises:
   first and second capacitors;
   one electrical conductor extending between first ends of the first and second capacitors; and
   an other electrical conductor extending between second ends of the first and second capacitors.

18. The apparatus of claim 17, wherein the at least one second electrical conductor structure comprises a third capacitor connected in series into the second electrical conductor structure.

19. The apparatus of claim 18, wherein the at least one second electrical conductor structure is removably connected between the one electrical conductor and the other electrical conductor of the first electrical conductor structure.

20. The apparatus of claim 16, further comprising a second reconfigurable RF antenna, wherein the second reconfigurable RF antenna comprises:
- an additional electrical conductor structure including an additional mesh having the shape of the loop, and
- at least one other electrical conductor structure which is removably connected to the additional conductor structure so that the additional mesh is divided by the at least one other electrical conductor structure into at least a pair of other meshes, each of the other meshes having the shape of a loop,
- wherein the other mesh are each resonant at a same, or substantially the same, frequency as the additional mesh.

* * * * *